United States Patent
Hara et al.

(10) Patent No.: US 7,480,140 B2
(45) Date of Patent: Jan. 20, 2009

(54) SYSTEM FOR COOLING INTERIOR AND EXTERNAL HOUSING SURFACES OF AN ELECTRONIC APPARATUS

(75) Inventors: Chikashi Hara, Yamato (JP); Kazuyo Hayakawa, Sagamihara (JP); Satoru Kumai, Amagasaki (JP); Taichiroh Nomura, Sagamihara (JP); Toshio Sakurai, Amagasaki (JP); Hiroyuki Takenoshita, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 11/225,291

(22) Filed: Sep. 13, 2005

(65) Prior Publication Data

US 2006/0056151 A1    Mar. 16, 2006

(30) Foreign Application Priority Data

Sep. 16, 2004   (JP)   ............... 2004-269416

(51) Int. Cl.
*H05K 7/20*   (2006.01)
*H05K 5/00*   (2006.01)
*A47B 81/00*   (2006.01)
*A47B 97/00*   (2006.01)

(52) U.S. Cl. .............. 361/692; 361/695; 361/694; 361/707; 361/709; 361/714; 312/223.2; 454/184

(58) Field of Classification Search ......... 361/695–697, 361/707, 709, 714; 454/184; 312/223.2
See application file for complete search history.

(56) References Cited

U.S. PATENT DOCUMENTS

| | | | | |
|---|---|---|---|---|
| 4,682,268 A * | 7/1987 | Okano et al. | ................ | 361/697 |
| 5,063,476 A * | 11/1991 | Hamadah et al. | ............ | 361/697 |
| 5,475,563 A * | 12/1995 | Donahoe et al. | ............ | 361/695 |
| 5,953,211 A * | 9/1999 | Donahoe et al. | ............ | 361/704 |
| 6,084,769 A * | 7/2000 | Moore et al. | ................ | 361/687 |
| 6,094,347 A * | 7/2000 | Bhatia | ........................ | 361/695 |
| 6,104,607 A * | 8/2000 | Behl | .......................... | 361/687 |
| 6,172,871 B1 * | 1/2001 | Holung et al. | ............. | 361/687 |
| 6,266,243 B1 * | 7/2001 | Tomioka | .................... | 361/695 |
| 6,459,577 B1 * | 10/2002 | Holmes et al. | ............. | 361/690 |
| 6,522,535 B1 * | 2/2003 | Helot et al. | ................ | 361/687 |
| 6,542,360 B2 * | 4/2003 | Koizumi | ..................... | 361/687 |
| 6,618,248 B1 * | 9/2003 | Dalheimer | .................. | 361/687 |
| 2001/0033475 A1 * | 10/2001 | Lillios et al. | ............... | 361/687 |
| 2004/0027798 A1 * | 2/2004 | Fujiwara | .................... | 361/687 |
| 2004/0156180 A1 * | 8/2004 | Westerinen et al. | ......... | 361/818 |

* cited by examiner

*Primary Examiner*—Jayprakash N Gandhi
*Assistant Examiner*—Bradley H. Thomas
(74) *Attorney, Agent, or Firm*—Dillon & Yudell LLP

(57) ABSTRACT

A system for cooling interior and external housing surfaces of an electronic apparatus. The apparatus includes at least one electronic component, a heat transfer mechanism for transferring to an external surface of the apparatus heat generated by the electronic component, and a cooling mechanism for cooling the external surface of the apparatus. The cooling mechanism also includes an airflow generation device and an opening that enables airflow to simultaneously flow over at least one electronic component within the apparatus and over the external surface to dissipate the heat generated by the at least one electronic component.

4 Claims, 4 Drawing Sheets

SYSTEM FOR COOLING INTERIOR AND EXTERNAL HOUSING SURFACES OF AN ELECTRONIC APPARATUS

PRIORITY CLAIM

This application claims priority of Japanese Patent Application No. 2004-269416, filed on Sep. 16, 2004, and entitled, "Electronic Apparatus Comprising a Cooling Apparatus for Cooling Interior and External Housing Surfaces."

BACKGROUND OF THE INVENTION

1. Technical Field

The present invention relates in general to the field of electronic apparatuses. More particularly, the present invention relates to the field of cooling electronic apparatuses. Still more particularly, the present invention relates to a system of cooling interior and external housing surfaces in electronic apparatuses.

2. Description of Related Art

Recently, for compact electronic apparatuses such as portable personal computers (PCs), the performance of internally provided electronic components has been improved and their installation density has been increased. As a result, during the operation of the compact electronic apparatuses, heat generated by the internally mounted electronic components has become a serious problem. Since there is a tendency that the thickness, weight, and size of the housings are reduced, the heat generated by the electronic components tends to be retained internally. Therefore, to ensure the performance and the reliability of electronic components, there is a need for a system of removing generated heat quickly to cool the housings of a data processing system such as a PC.

Since housings provided for compact electronic apparatuses have gotten smaller as the demand for more compact data processing systems increase, the installation of cooling apparatuses in the housings, such as fans, is difficult. Therefore, parts such as copper plates, aluminum plates, or heat pipes have been employed to move heat from heat generating sources to locations where the heat can be discharged. If the generated heat is not removed, the performance of the electronic components within the data processing system will degrade.

According to one method for locating a fan inside a housing, a very small fan with a limited flow rate is employed. Since the density in which components is high, it is difficult for air impelled by the fan to be dispersed throughout the housing. This difficulty results in electronic components within the data processing system that do receive adequate cooling. When electronic components are inadequately cooled, erroneous operations or failures may occur, and the safely and reliability of the components may be degraded.

According to another method for transferring head generated by an electronic component, heat is conveyed to the inner surface of a housing and is externally removed at its outer surface. Since the removal of heat from the outer surface of the housing depends on the natural transfer of heat based on the difference between atmospheric temperature and the surface temperature of the housing, the heat discharge effect is not satisfactory. Furthermore, since during operation, the temperature at the surface of the housing is high, a person who comes in contact with the surface will experience an uncomfortably hot sensation which may result in a burn if the contact with the housing surface continues for an extended period of time. Thus, since people tend to carry personal computers, such as mobile PCs, in their hands or use them in their laps, heat at the surfaces of the housings has also become a problem. From the viewpoint of the users, measures are required (e.g., temperature reductions and surface cooling) that will reduce the heat of housing surfaces that regularly come in contact with the user. As a conventional countermeasure, the surfaces of housings are covered with materials with low thermal conductivity, such as resin. According to this method, only a small amount of heat is removed from the housing surfaces, and only reduced cooling effects are provided for internal electronic components.

Conventional techniques for the provision of cooling apparatuses in portable PCs are also disclosed in Japanese Utility Models No. 3064584 and No. 3043379, for example. However, these techniques are provided merely for the cooling PC housing interiors, not for reducing the temperatures of housing surfaces.

SUMMARY OF THE INVENTION

A system for cooling interior and external housing surfaces of an electronic apparatus is disclosed. The apparatus includes at least one electronic component, a heat transfer mechanism for transferring to an external surface of the apparatus heat generated by the electronic component, and a cooling mechanism for cooling the external surface of the apparatus. The cooling mechanism also includes an airflow generation device and an opening that enables airflow to simultaneously flow over at least one electronic component within the apparatus and over the external surface to dissipate the heat generated by the at least one electronic component.

The above-mentioned features, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will be best be understood by reference to the following detailed description of an illustrative embodiment when read in conjunction with the accompanying drawings, wherein:

DETAILED DESCRIPTION OF THE PREFERRED EMBODIMENT

The present invention provides the cooling of the external surface of a housing for an electronic apparatus and of the electronic components (that generate heat during operation) that are disposed within the housing.

Figure 1:
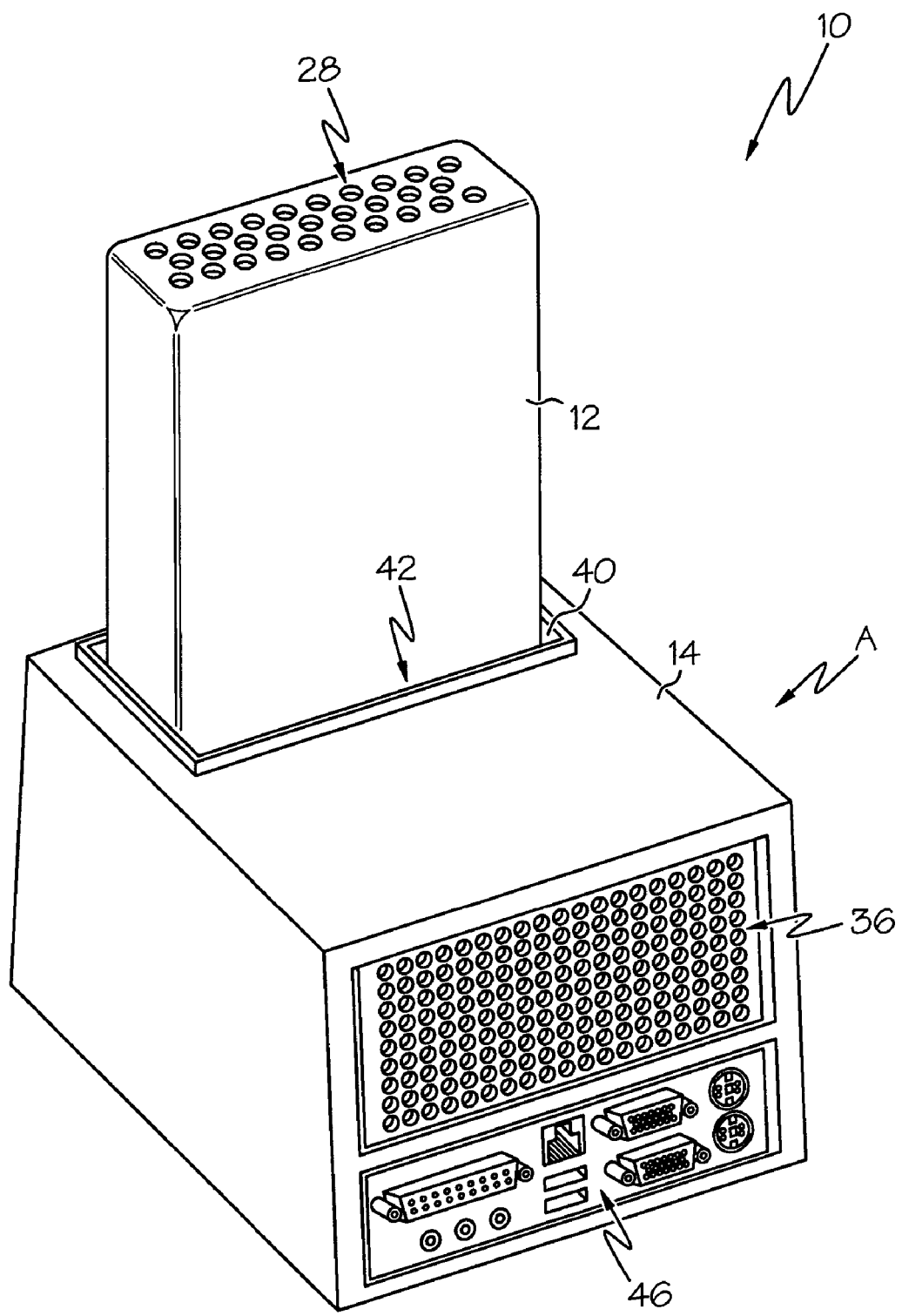
FIG. 1 is an oblique rear view of an exemplary personal computer (PC) according to a preferred embodiment of the present invention.
Figure 2:
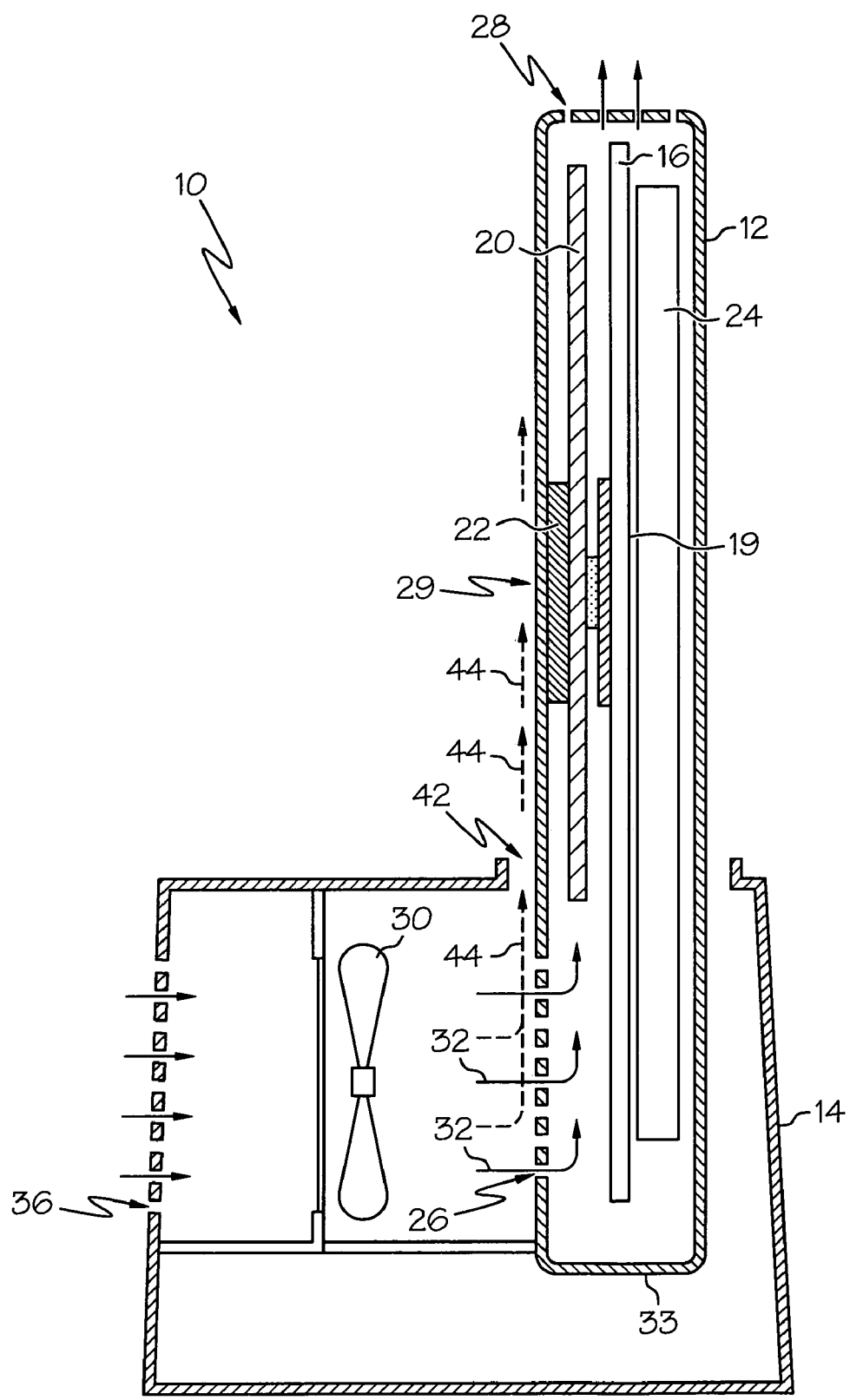
FIG. 2 is a cross-sectional view of the PC illustrated in FIG. 1.

The present invention will now be described by employing a portable PC as an example. However, those with skill in this art will appreciate that the present invention is not limited to a PC and can be applied for other types of electronic apparatus. FIG. 1 is an oblique rear view of a portable PC 10 in which a preferred embodiment of the present invention may be implemented. FIG. 2 is a cross-sectional view of the PC in FIG. 1 taken in a direction indicated by A.

A housing is formed of a core housing 12 and a cradle housing 14. A CPU 18 mounted on a printed circuit board 16, a heat sink 20 connected to the CPU 18 via a thermal conductive flexible member 19, ribs 22 that secure the heat sink 20 to the core housing 12, and electronic components 24 (not shown in details), such as a memory, various control ICs and an HDD, are arranged in the core housing 12.

A connector (not shown) for electric connection is provided at an end 33 of the core housing 12, and is detachable to a connector (not shown) mounted on the printed circuit board that is located at the bottom of an opening 40 formed in the cradle housing 14 and is used for an interface (I/O) 46. The core housing 12 is operated as a PC while being connected to the connector of the cradle housing 14. During the operation, the temperature on the surface of the core housing 12 is increased very much. Since the core housing 12 can be removed from the cradle housing 14 and carried, the core housing 12 can be used as a PC by being attached to another cradle housing in a different place.

The cradle housing 14 incorporates interfaces (I/Os) for a power source and external devices, such as a display device, a keyboard and a mouse), and have connectors 46 for these interfaces. A fan 30 is provided inside the cradle housing 14, and by the fan 30, air is taken through an opening 36 inside the cradle housing 14, and is impelled from the fan 30 to the surface of the core housing 12. An opening 42 is formed in the upper portion of the cradle housing 14, so that the part of the air from the fan 30 is output through the opening 42 and drifted along a surface 29 of the core housing 12, as indicated by arrows 44 (hereinafter referred to as an airflow 44).

The amount of the airflow 44 depends on the capacity of the fan 30 and the sizes of the openings 36, 26, 28 and 42. The airflow 44 does not necessarily reach the upper end of the core housing 12, i.e., the vicinity of the opening 28, but at least accelerate the discharge of heat transferred from the ribs 22. The amount of the airflow 44 is determined to satisfy the need. The fan 30 and the cradle housing 14 are tightly sealed except for the openings 36 and 42 to prevent the flow of air (air leaking) except for the airflows 44 and 32 (will be described later in detail). With this arrangement, the pressure inside the cradle housing 14 is higher than the surroundings, and air is easily moved to the core housing 12 where pressure is lower and the upper end 28. By the airflow 44, a surface 29 of the core housing 12 is cooled during the operation of the PC, and as a result, the temperature on the surface 29 is reduced. At the same time, the effects (cooling effects) for removing heat that is transferred from the CPU 18 to the heat sink 20 and the ribs 22 to the core housing 12 are accelerated.

The part of the air impelled by the fan 30 flows from the opening 26 of the core housing 12 to the core housing 12, and is drifted along the core housing 12 as the airflow 32 that is to be externally discharged from the opening 28. By this airflow 32, the electronic components, such as the CPU 18, that generate heat during the operation, the heat sink 20 and the reverse surface of the core housing 12 are cooled. As is described above, in the PC shown in FIG. 2, the airflows 44 and 32 flow at the same time along both the obverse surface and inside of the core housing 12. As a result, the effects for cooling the electronic components in the core housing 12 are increased, and the rise of the temperature on the surface of the housing 12 can be suppressed. The same effects can be obtained by drifting the airflows 32 and 44 in the direction opposite to the direction in FIG. 2.

The ribs 22 in FIG. 2 are elongated in cross section, because the area where the core housing 12 and the heat sink 20 contact is increased and heat conduction from the heat sink 20 to the core housing 12 is more efficient. Further, this shape is not an obstacle in an air flow path and can provide an effective heat discharge function.

Figure 3C:
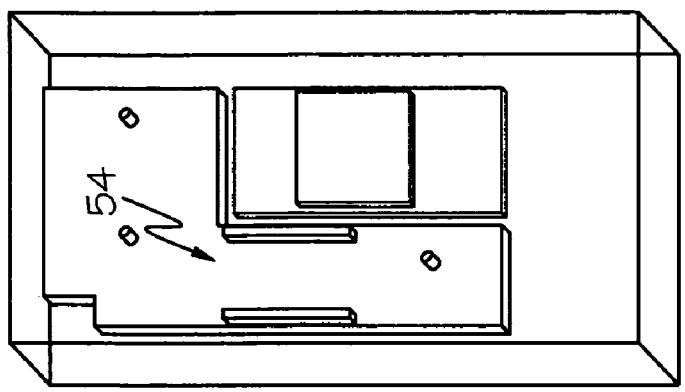
FIGS. 3A-3C depict plan views of example locations and shapes of libs on a heat sink according to a preferred embodiment of the present invention.
Figure 3B:
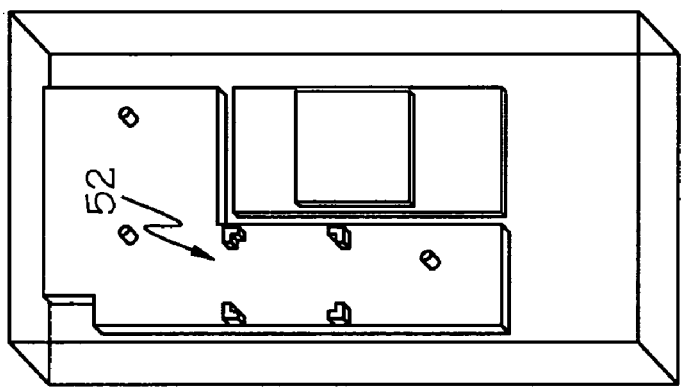
Figure 3A:
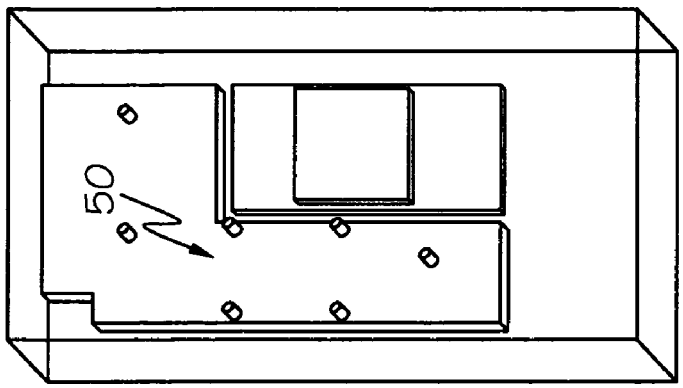

FIGS. 3A, 3B and 3C are plan views of example locations and shapes of the ribs 22 on the heat sink 20. In FIG. 3A, cylindrical ribs 22 are located at four points 50. In FIG. 3B, L-shaped ribs 22 are located at four points 52. In FIG. 3C, two elongated ribs 22 are located at points 54, as used for the PC in FIG. 2. The shapes, the sizes and the volumes of the ribs 22 are optimized for a portable PC in accordance with the size of the housing of the PC, the amount of heat generated by incorporated electronic components, the location of a heat generation device on a substrate, the location where air is taken in from a fan, the amount of air impelled by the fan and the direction of an airflow. As a result, the amount of thermal conduction can be adjusted, and heat generated by the heat generation element can be efficiently transferred to the surface of the housing.

In the example in FIG. 2, since the ribs 22 are formed elongated, the strength whereby the heat sink 20 is secured to the housing is increased, and the deflection of the heat sink 20 seldom occurs when a load is imposed by connection with the CPU. Further, at least two ribs 22 are arranged at an interval in order to obtain the path of the airflow 32 that flows in the core housing 12.

A thermal conductive material, such as an aluminum alloy, copper, stainless steel or a magnesium alloy, can be employed for the heat sink 20 and the ribs 22. When a heat sink and a heat pipe are employed together as a heat transfer mechanism, the cooling effects are more increased.

Figure 4:
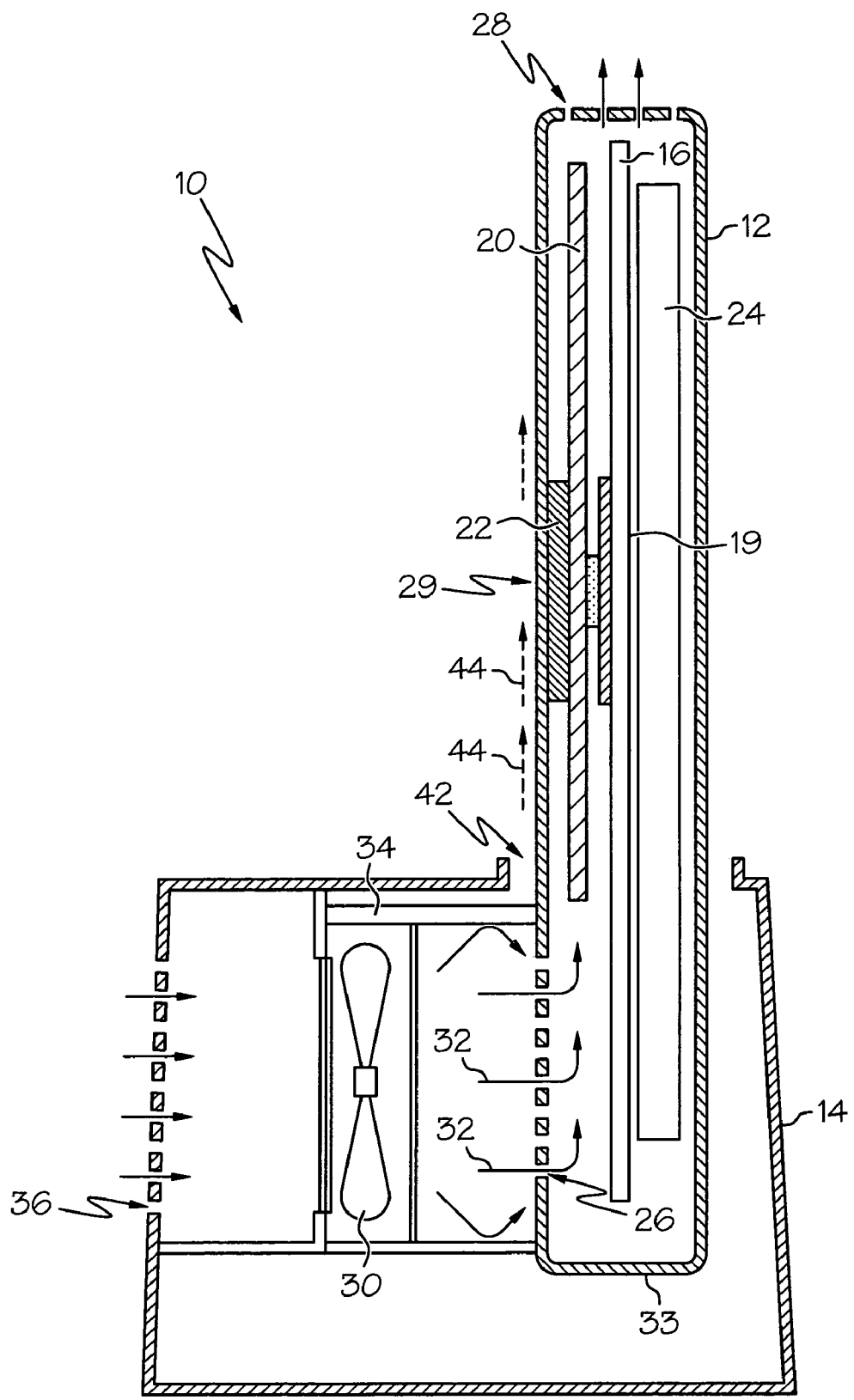
FIG. 4 illustrates a cross-sectional view of the PC in FIG. 2 where a duct is provided according to another preferred embodiment of the present invention.

The following experiment was conducted to examine the cooling effects provided by the airflow 44 that flows along the surface of the housing. FIG. 4 is a cross-sectional view of a PC 10' wherein a duct 34 is formed in the cradle housing 14 of the PC in FIG. 2 to prevent the air impelled by the fan 30 from being discharged through the opening 42. In the PC 10' in FIG. 4, air impelled by the fan 30 enters the core housing 12, and is drifted as an airflow 32 in the core housing 12 to be discharged from the upper opening 28.

For the PC 10 in FIG. 2 and the PC 10' in FIG. 4, the two elongated libs 22 (size: 2 mm×25 mm×1 mm, made of A15052) were attached to the heat sink 20 (size: 50 mm×100 mm×0.5 mm, made of A11050), and the cooling effects by using the airflow 44 that flows along the surface of the housing were examined. As a result, for the PC 10 in FIG. 2 using the airflows 32 and 44, the temperature on the housing surface 29 and the temperature of the CPU 18 could be reduced respectively by about 2° C. and by about 4° C., compared with the PC 10' in FIG. 4 employing only the airflow 32. The data for the conditions in the experiment are as follows.

CPU clock: 1 Ghz
fan: 4200 rpm
housing surface temperature:
48.9° C. with the airflow 44
50.8° C. with no airflow 44
CPU temperature:
77.2° C. with the airflow 44
81.3° C. with no airflow 44
environmental temperature: 35° C.

The present invention has been explained by using the PCs in FIGS. 1 to 4. However, the present invention is not limited to these PCs. For example, instead of a fan using airflows, the cooling system for this invention may be a system where a coolant flows along a narrow pipe formed on the surface of the housing, or a system wherein a cooling device, such as a Peltier device, is located at a portion (heat spot) that becomes especially hot. According to the present invention, an appropriate cooling apparatus can be employed while taking into account the shape, the size and the heat generating condition of the electronic apparatus. So long as the cooling of the heat generating electronic components in the housing and cooling of the surface of the housing are performed at the same time, greater cooling effects of the invention can be obtained by using any type of cooling apparatus. It will be obvious for one having ordinary skill in the art that the present invention can be variously modified without departing from the scope of the subject of the invention.

While the invention has been particularly shown and described with reference to a preferred embodiment, it will be understood by those skilled in the art that the various changes in form and detail may be made therein without departing from the spirit and scope of the invention.

What is claimed is:

1. A portable system, which comprises:
   a core housing, said core housing including an inlet opening and an outlet opening, said core housing containing electronic components thermally coupled to said core housing;
   a cradle housing, said cradle housing including a receiver opening adapted to receive a portion of said core housing in an inner chamber of said cradle housing, said portion of said core housing including said inlet opening of said core housing, said receiver opening being sized to form an outlet opening between said cradle housing and said core housing, said cradle housing including an inlet opening, said cradle housing including a fan positioned in said inner chamber of said cradle housing to draw air in through said inlet opening of said cradle housing and direct air out through said outlet opening formed between said cradle housing and said inlet opening of said core housing, whereby air flows over an outer surface of said core housing and through said core housing between said inlet opening of said core housing and said outlet opening of said core housing.

2. The portable system as claimed in claim 1, wherein said electronic components are thermally coupled to said core housing by:
   a heat sink thermally coupled to said electronic components; and,
   a plurality of longitudinally extending thermally conductive ribs coupling said heat sink to an inner surface of said core housing.

3. The portable system as claimed in claim 2, wherein said electronic components are mounted to a printed circuit board thermally coupled to said heat sink.

4. The portable system as claimed in claim 1, wherein said core housing is received in said receiver opening of said cradle housing in a vertical orientation, whereby air flows upwardly over said outer surface of said core housing and upwardly through said core housing between said inlet opening of said core housing and said outlet opening of said core housing.

* * * * *